United States Patent
Jiang

(10) Patent No.: US 8,283,758 B2
(45) Date of Patent: Oct. 9, 2012

(54) MICROELECTRONIC PACKAGES WITH ENHANCED HEAT DISSIPATION AND METHODS OF MANUFACTURING

(75) Inventor: Hunt Hang Jiang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 29 days.

(21) Appl. No.: 12/970,729

(22) Filed: Dec. 16, 2010

(65) Prior Publication Data

US 2012/0153446 A1 Jun. 21, 2012

(51) Int. Cl.
*H01L 23/02* (2006.01)

(52) U.S. Cl. . 257/673; 257/676; 257/680; 257/E23.001; 257/E23.031; 257/E23.023; 257/E23.066

(58) Field of Classification Search ............... 257/673, 257/675, 676, 680, E23.001, E23.031, E23.023, 257/E23.066
See application file for complete search history.

(56) References Cited

U.S. PATENT DOCUMENTS

2007/0018291 A1* 1/2007 Huang et al. .................. 257/676
2009/0115035 A1* 5/2009 Bayan et al. .................. 257/673

* cited by examiner

*Primary Examiner* — Kimberly Rizkallah
*Assistant Examiner* — Timor Karimy
(74) *Attorney, Agent, or Firm* — Perkins Coie LLP

(57) ABSTRACT

Several embodiments of microelectronic packages with enhanced heat dissipation and associated methods of manufacturing are disclosed herein. In one embodiment, a microelectronic package includes a semiconductor die having a first side and a second side opposite the first side and a lead frame proximate the semiconductor die. The lead frame has a lead finger electrically coupled to the first side of the semiconductor die. The microelectronic package also includes an encapsulant at least partially encapsulating the semiconductor die and the lead frame. The encapsulant does not cover at least a portion of the second side of the semiconductor die.

7 Claims, 5 Drawing Sheets

MICROELECTRONIC PACKAGES WITH ENHANCED HEAT DISSIPATION AND METHODS OF MANUFACTURING

TECHNICAL FIELD

The present technology is directed to microelectronic packages with enhanced heat dissipation and associated methods of manufacturing and operation.

BACKGROUND

Semiconductor chips or dies typically are encapsulated in a package that protects the chips from the surrounding environment. The packages typically include leads or other connection points that allow the encapsulated die to be electrically coupled to another component, e.g., a printed circuit board. FIG. 1 is a schematic cross-sectional diagram of a microelectronic package 100 in accordance with the prior art. As shown in FIG. 1, the microelectronic package 100 includes a semiconductor die 104 attached directly to the leads 102 of a lead frame 101 with a die attach adhesive 105 in a leads-over-chip arrangement. Some or all of the terminals 106 of the semiconductor die 104 can be electrically connected to the leads 102 of the lead frame 101 by wire bonds 108. The connected lead frame 101 and die 104 may then be encapsulated in an encapsulant 110 to complete the microelectronic package 100.

The semiconductor die 104 typically generates a significant amount of heat that can cause structural and/or functional failure in the microelectronic package 100 if not adequately dissipated. In the leads-over-chip arrangement shown in FIG. 1, the die attach adhesive 105 typically provides an adequate thermal path to allow the leads 102 to conduct heat away from the semiconductor die 104. However, in other applications, the semiconductor die 104 may be attached to the leads 102 in a flip-chip arrangement with only solder balls or bumps (not shown), which may not provide an adequate thermal path to dissipate the generated heat from the semiconductor die 104. Accordingly, several improvements for enhancing heat dissipation in microelectronic packages may be desirable.

DETAILED DESCRIPTION

Several embodiments of the present technology are described below with reference to microelectronic packages with enhanced heat dissipation and associated methods of manufacturing and operation. Typical microelectronic packages include microelectronic circuits or components, thin-film recording heads, data storage elements, microfluidic devices, and other components manufactured on microelectronic substrates. Microelectronic substrates can include semiconductor pieces (e.g., doped silicon wafers or gallium arsenide wafers), non-conductive pieces (e.g., various ceramic substrates), or conductive pieces (e.g., metal or metal alloy). Many of the details of certain embodiments are also described below with reference to semiconductor dies. The term "semiconductor die" is used throughout to include a variety of articles of manufacture, including, for example, individual integrated circuit dies, imager dies, sensor dies, and/or dies having other semiconductor features.

Many specific details of certain embodiments are set forth in the following text to provide a thorough understanding of these embodiments. Several other embodiments can have configurations, components, and/or processes different from those described below. A person skilled in the relevant art, therefore, will appreciate that additional embodiments may be practiced without several of the details of the embodiments shown in FIGS. 2-5.

Figure 2:
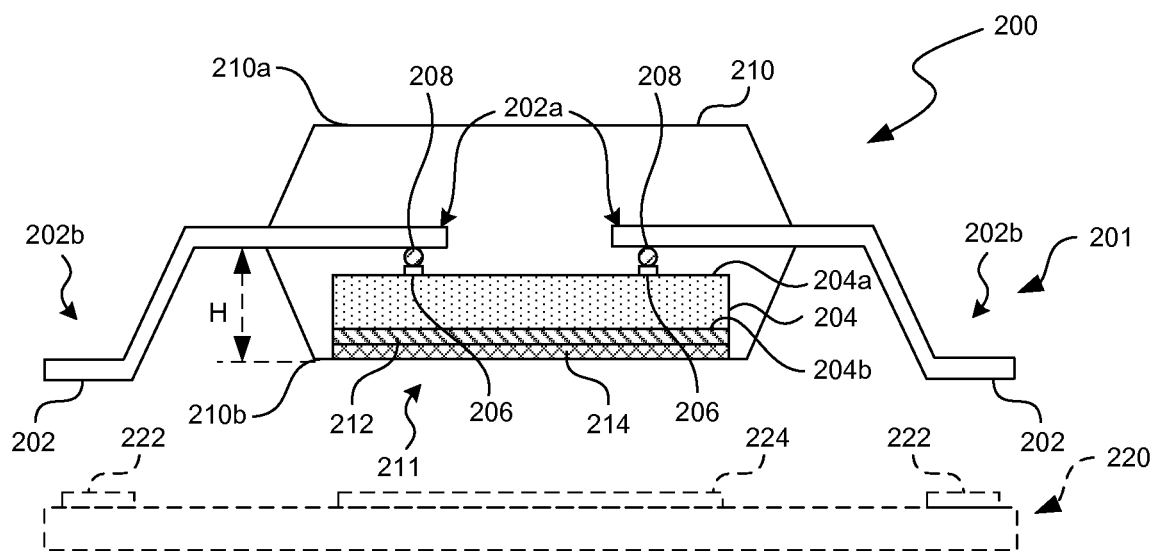
FIG. 2 is a schematic cross-sectional diagram of a microelectronic package in accordance with embodiments of the technology.

FIG. 2 is a schematic cross-sectional diagram of a microelectronic package 200 in accordance with embodiments of the technology. As shown in FIG. 2, the microelectronic package 200 can include a lead frame 201, a semiconductor die 204 coupled to the lead frame 201 with electrical couplers 208, and an encapsulant 210 at least partially encapsulating the lead frame 201 and the semiconductor die 204. Even though only the foregoing particular compounds are shown in FIG. 2, in other embodiments, the microelectronic package 200 may also include interposers, heat sinks, and/or other suitable components.

The lead frame 201 can include a plurality of lead fingers 202. As shown in FIG. 2, the lead fingers 202 individually include a first portion 202a encapsulated in the encapsulant 210 and a second portion 202b extending beyond the encapsulant 210. The first portion 202a of the individual lead fingers 202 is coupled to corresponding electrical couplers 208. The second portion 202b may be configured to interface with external devices. In the illustrated embodiment, two lead fingers 202 are shown. In other embodiments, the lead frame 201 can include any desired number of lead fingers, die paddles, and/or other suitable components.

The semiconductor die 204 can include any suitable type of integrated circuit device. For example, in certain embodiments, the semiconductor die 204 can include a plurality of metal-oxide-semiconductor field-effect transistors ("MOSFETs"), junction gate field-effect transistors ("JFETs"), insulated gate bipolar transistors, capacitors, and/or other suitable electrical components. In other examples, the semiconductor die 100 can include other suitable types of electrical and/or mechanical components.

As shown in FIG. 2, the semiconductor die 204 has a plurality of bond sites 206 at a first side 204a. The individual bond sites 206 are coupled with corresponding electrical couplers 208, which in turn are coupled to corresponding lead fingers 202. In certain embodiments, the electrical couplers 208 can include solder balls attached to the bond sites 206. As used herein, the term "solder" generally refers to a fusible metal alloy with a melting point in the range of about 90° C. to 450° C. Examples of a solder include alloys of at least some of copper (Cu), tin (Sn), lead (Pb), silver (Ag), zinc (Zn), and/or other suitable metals. In other embodiments, the electrical couplers 208 can also include solder bumps, gold bumps, copper pillar bumps, and/or other suitable electrically conductive couplers.

The semiconductor die 204 can also include an optional barrier material 212 and a thermally conductive material 214 at a second side 204b opposite the first side 204a. In the illustrated embodiment, the optional barrier material 212 is between the semiconductor die 204 and the thermally conductive material 214. In other embodiments, the optional barrier material 212 may be omitted, and the thermally conductive material 214 may be formed directly on the second side 204b of the semiconductor die 204. In further embodiments, the thermally conductive material 214 may be omitted with only the optional barrier material 212 on the second side 204b of the semiconductor die 204.

In certain embodiments, the optional barrier material 212 can include silicon oxide ($SiO_2$), silicon nitride ($Si_3N_4$), and/or other suitable insulating materials. In other embodiments, the optional barrier material 212 can include tungsten (W), tantalum (Ta), rhenium (Re), tantalum pentoxide ($Ta_2O_5$), and/or other suitable refractory materials and oxides thereof. In further embodiments, the optional barrier material 212 can also include a combination of the foregoing materials arranged in layers and/or in a homogeneous form.

The thermally conductive material 214 can include a material that is thermally conductive and generally solderable. As used herein, the term "solderable" generally refers to having a material property that permits ready attachment with a solder during reflow. For example, in one embodiment, the thermally conductive material 214 includes a titanium/nickel/silver (Ti/Ni/Ag) tri-metal alloy. In another embodiment, the thermally conductive material 214 can include copper (Cu), aluminum (Al), silver (Ag), and/or other suitable metals attachable to a solder during reflow. In further embodiments, the thermally conductive material 214 can include a combination of metals, metal alloys, and/or other suitable materials with a thermal conductivity greater than about 0.5 W/(m·K).

The encapsulant 210 can include an epoxy and/or other suitable thermosetting polymers. As shown in FIG. 2, the encapsulant 210 includes a first surface 210a proximate the lead frame 201 and a second surface 210b proximate the second side 204b of the semiconductor die 204. The encapsulant 210 can also include an opening 211 at the second surface 210b through which the thermally conductive material 214 is exposed. For example, in the illustrated embodiment, the second surface 210b of the encapsulant 210 is generally co-planar with the thermally conductive material 214. As a result, substantially the entire area of the thermally conductive material 214 is exposed through the opening 211. In other embodiments, the opening 211 in the encapsulant 210 can have other configurations, as discussed in more detail with reference to FIGS. 4 and 5. In any of these embodiments, the encapsulant 210 does not cover at least a portion of the thermally conductive material 214 on the second side 204b of the semiconductor die 204. As a result, the second side 204b of the semiconductor die 204 can be generally solderable.

Several embodiments of the microelectronic package 200 can have improved heat dissipation compared to conventional devices. In certain applications, the microelectronic package 200 can be attached to a carrier substrate 220 (shown in phantom lines for clarity). In the illustrated embodiment, the carrier substrate 220 includes a printed circuit board having a thermal ground pad 224 and a plurality of contact pads 222. The thermally conductive material 214 on the second side 204b of the semiconductor die 204 can be attached to the thermal ground pad 224 with a solder paste, an epoxy, and/or other suitable thermally conductive adhesives (not shown). The second portions 202b of the lead fingers 202 can be attached to the corresponding contact pads 222 with a solder paste and/or other electrically conductive materials (not shown). In other embodiments, the carrier substrate 220 can include a ceramic substrate and/or other suitable substrates. In further embodiments, the carrier substrate 220 can also include metallization layers, heat sinks, and/or other suitable components.

In operation, power and/or data signals may be provided from the carrier substrate 220 to the semiconductor die 204 via the contact pads 222 and the lead fingers 202. The semiconductor die 204 performs certain predetermined functions (e.g., power switching, signal processing, etc.) based on the provided power and/or data signals. While performing such functions, the semiconductor die 204 generates heat. Unlike conventional devices, in which the generated heat can only be dissipated via a first thermal path that includes the electrical couplers 208 and the lead fingers 202, in the microelectronic package 200, the generated heat can also be conducted away via a second thermal path. For example, the generated heat can also be dissipated via the second side 204b of the semiconductor die 204, the optional barrier material 212, and the thermally conductive material 214 attached to the thermal ground pad 224 of the carrier substrate 220. As a result, the microelectronic package 200 can dissipate heat away from the semiconductor die 204 much more efficiently than in conventional devices.

Figure 1:
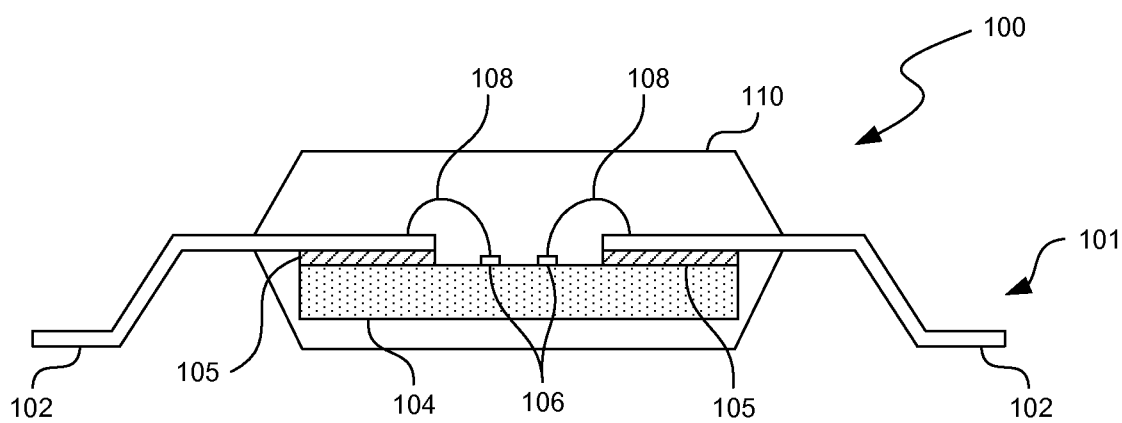
FIG. 1 is a schematic cross-sectional diagram of a microelectronic package in accordance with the prior art.
Figure 3A:
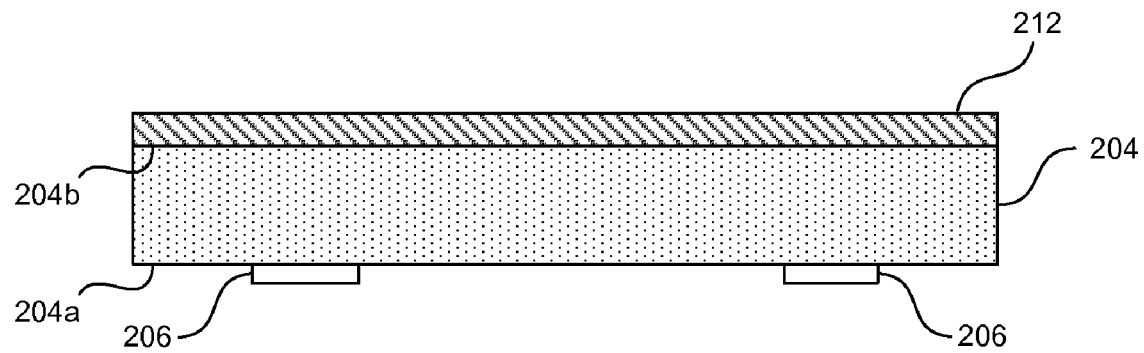
FIGS. 3A-3F are partially schematic, cross-sectional views of a portion of a semiconductor die and a lead frame undergoing an assembly process in accordance with further embodiments of the technology.

FIGS. 3A-3F are partially schematic, cross-sectional views of a portion of a semiconductor die and a lead frame undergoing an assembly process suitable for forming the microelectronic package 200 of FIG. 1 in accordance with further embodiments of the technology. As shown in FIG. 3A, an initial stage of the process can include forming the semiconductor die 204 with a target thickness via back grinding and/or other suitable techniques. In one embodiment, the target thickness of the semiconductor die 204 may be determined based on at least one of (1) a bottom-half body thickness (as represented by H in FIG. 2) of the microelectronic package 200; and (2) a stand-off height of the electrical couplers 208. In other embodiments, the target thickness of the semiconductor die 204 may be determined based on other suitable criteria. The process can then include forming the optional barrier material 212 on the second side 204b of the semiconductor die 204. Techniques for forming the optional barrier material 212 can include chemical vapor deposition ("CVD"), atomic layer deposition ("ALD"), and/or other suitable deposition techniques.

Figure 3B:
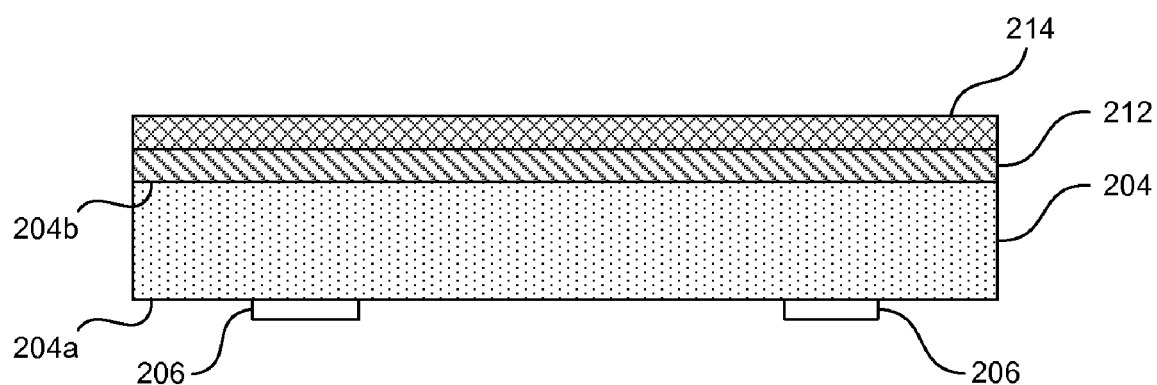

FIG. 3B shows a further deposition operation, in which the thermal conductive material 214 is formed on the optional barrier material 212. In one embodiment, the thermally conductive material 214 including a titanium/nickel/silver (Ti/Ni/Ag) tri-metal alloy may be formed using CVD, ALD, sputtering, electro-deposition, and/or other suitable techniques. In other embodiments, the thermally conductive material 214 may be screen-printed, adhesively attached, and/or otherwise bonded to the optional barrier material 212.

Figure 3C:
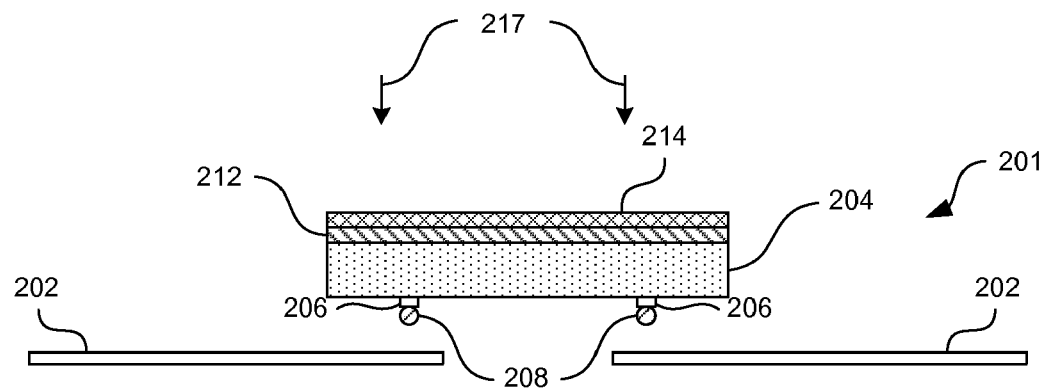

The semiconductor die 204 with the optional barrier material 212 and the thermally conductive material 214 may be flipped, and the electrical couplers 208 can be attached to the bond sites 206 of the semiconductor die 204 via tack welding, partial reflow, electro-plated solder bump formation, solder ball drop, and/or other suitable attachment techniques. Subsequently, As shown in FIG. 3C, the semiconductor die 204 may be flipped again to be attached to the lead frame 201 with the electrical couplers 208 therebetween (as indicated by the arrows 217). The lead frame 201 with the attached semiconductor die 204 may then be reflowed (e.g., in a reflow chamber, not shown) to secure these components together.

Figure 3D:
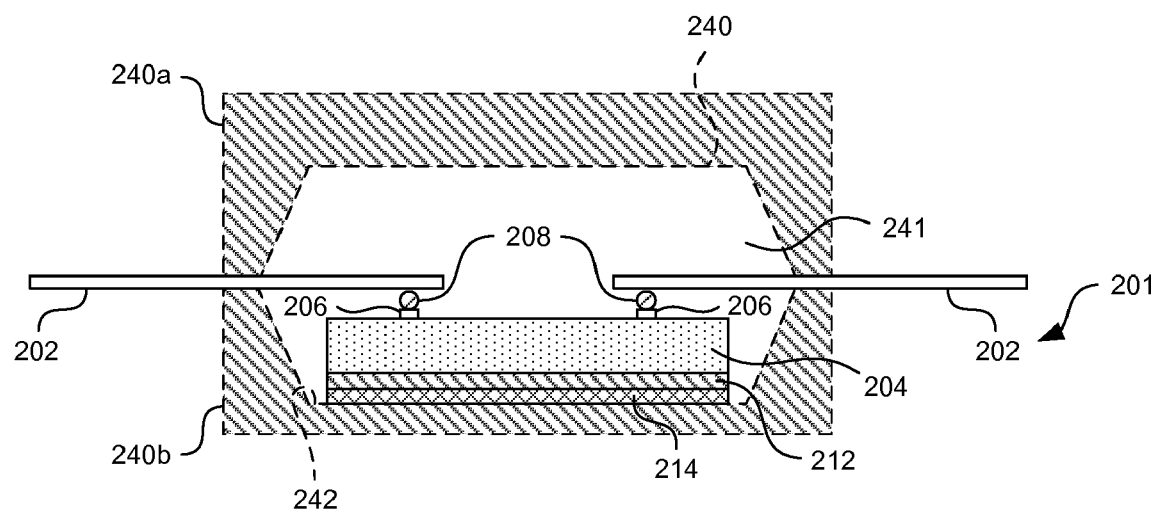

As shown in FIG. 3D, another stage of the process can include encapsulating the lead frame 201 and the semiconductor die 204 with the encapsulant 210 (FIG. 2). In the illustrated embodiment, the lead frame 201 with the attached semiconductor die 204 is placed in an interior space 241 of a mold 240 having a first portion 240a above the lead fingers 202 and a second portion 240b below the lead fingers 202. In the illustrated embodiment, the thermally conductive material 214 is generally flush with a bottom surface 242 of the mold 240. In another embodiment, a buffer material (e.g., a rubber sheet, not shown) may be placed between the bottom surface 242 of the mold 240 and the thermally conductive material 214. The buffer material can at least reduce the risk of cracking the semiconductor die 204 and/or covering the thermally conductive material 214 with subsequently injected encapsulant 210 (FIG. 2). In other embodiments, the thermally conductive material 214 may be recessed into the bottom surface 242 of the interior space 241 and/or can have other suitable configurations. Subsequently, the encapsulant 210 may be injected into the interior space 241 and cured in order to encapsulate the lead frame 201 and the semiconductor die 204.

In certain embodiments, the process can include additional post treatment operations. For example, the process can include a de-flashing operation in which any encapsulant 210 flashed over the bottom surface of the microelectronic package 200 and/or the leads 202 may be removed. In other embodiments, the process can also include lead plating, lead trimming and forming, package singulation from a lead frame strip (not shown), and/or other suitable operations.

Figure 3E:
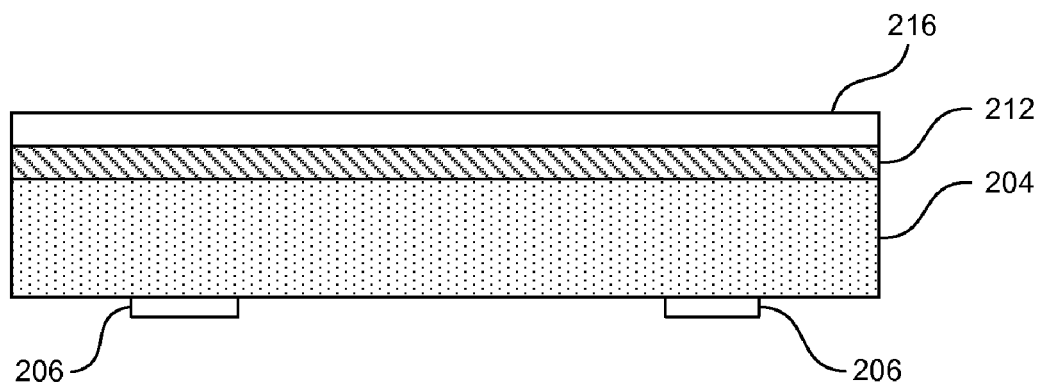
Figure 3F:
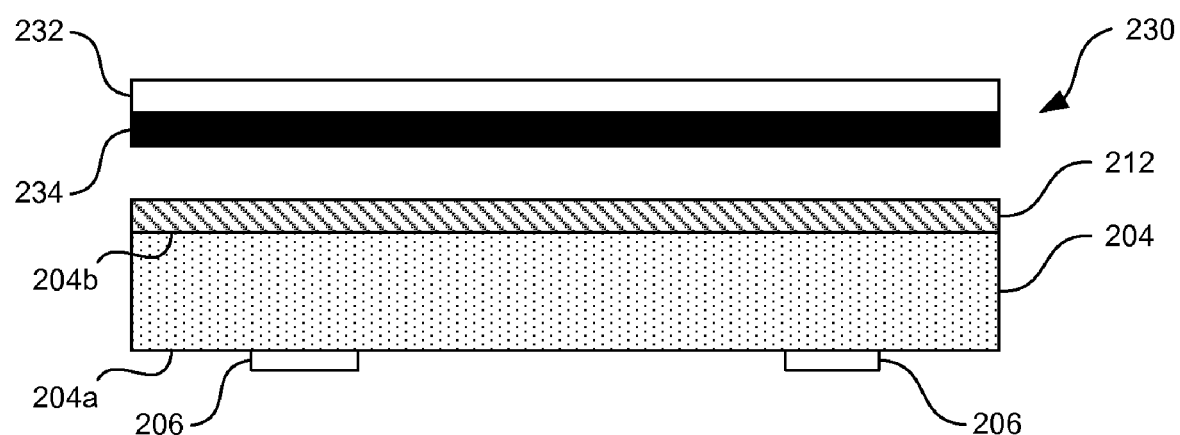

With reference to FIGS. 3A-3D, the thermally conductive material 214 is described as having a material deposited onto the optional barrier material 212, in other embodiments, the thermally conductive material 214 may be preformed and fastened to the semiconductor die 204 using other suitable mechanisms. For example, as shown in FIG. 3E, in certain embodiments, the thermally conductive material 214 can include a thermally conductive foil 216 (e.g., a copper or aluminum foil) attached to the optional barrier material via solid-solid bonding or an adhesive (not shown). In another example, as shown in FIG. 3F, the thermally conductive material 214 can include a preform 230 having a thermally conductive layer 232 and an adhesive layer 234. During assembly, the preform 230 may be attached to the second side 204b of the semiconductor die 204 either before or after encapsulation with the encapsulant 210 (FIG. 2).

Figure 4:
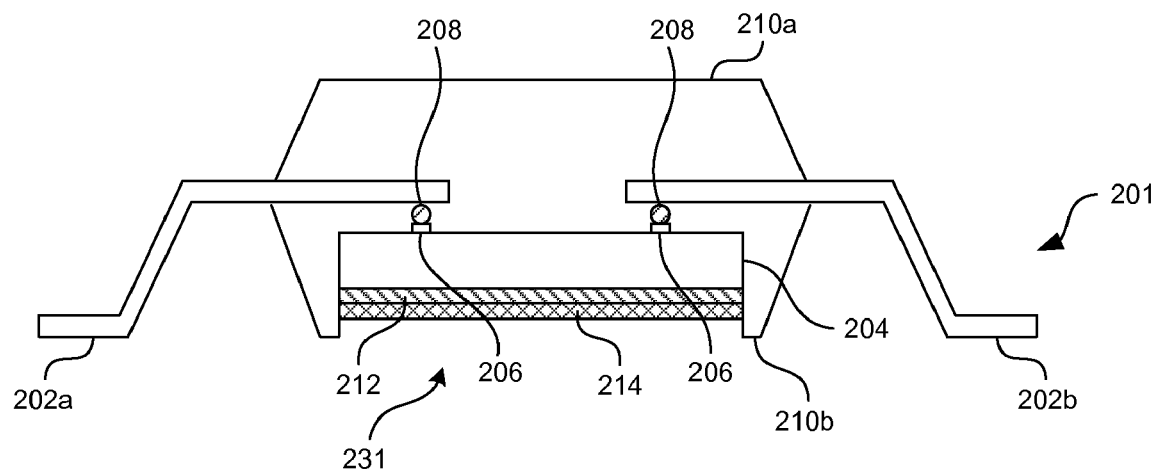
FIG. 4 is a schematic cross-sectional diagram of a microelectronic package in accordance with additional embodiments of the technology.

Even though the encapsulant 210 is shown in FIG. 2 as having a second surface 210b generally co-planar with the thermally conductive material 214, in other embodiments, the thermally conductive material 214 may be recessed into the encapsulant 210. For example, as shown in FIG. 4, the encapsulant 210 can include an opening 231 extending from the second surface 210b toward the semiconductor die 204. The opening 231 exposes substantially the entire area of the semiconductor die 204.

In one embodiment, the opening 231 may be formed during encapsulation, for example, by using a corresponding mold (not shown). In another embodiment, the encapsulant 210 may completely encapsulate the semiconductor die 204, and subsequently a portion of the encapsulant 210 is removed to form the opening 231. In further embodiments, the opening 231 may be formed via other suitable techniques.

When being attached to the carrier substrate 220 (FIG. 2), in one embodiment, the opening 231 may be filled with a solder paste and/or other suitable conductive materials. In another embodiment, a thermally conductive spacer (not shown) may be disposed in the opening 231 to be in contact with the thermally conductive material 214.

Figure 5:
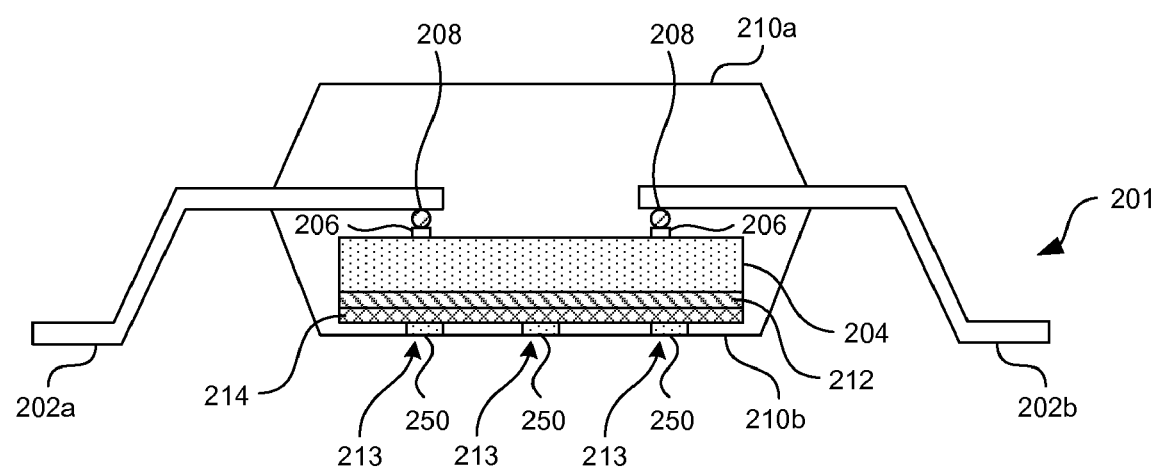
FIG. 5 is a schematic cross-sectional diagram of a microelectronic package in accordance with further embodiments of the technology.

In another example, as shown in FIG. 5, the encapsulant 210 may include a plurality of openings 213 that individually expose a portion of the thermally conductive material 214. The openings 213 may be formed by removing a portion of the encapsulant 210 via laser ablation, etching, and/or other suitable techniques. The openings 213 may be filled with a solder paste 250 and/or other suitable conductive materials before being attached to the carrier substrate 220 (FIG. 2).

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

I claim:

1. A microelectronic package, comprising:
    a semiconductor die having a bond site at a first side and a second side opposite the first side, the semiconductor die further including a thermally conductive material formed on the second side of the semiconductor die;
    a lead frame proximate the semiconductor die, the lead frame having a lead finger;
    a solder ball between the bond site of the semiconductor die and the lead finger, the solder ball forming an electrical connection between the bond site of the semiconductor die and the lead finger of the lead frame;
    an encapsulant at least partially encapsulating the semiconductor die, the lead frame, and the solder ball, the encapsulant having a first surface opposite a second surface, and the encapsulant also including a plurality of openings extending toward the semiconductor die from the second surface; and
    wherein the plurality of openings individually expose a portion of the thermally conductive material and the thermally conductive material is generally solderable.

2. The microelectronic package of claim 1 wherein:
    the semiconductor die further includes a barrier material, wherein the barrier material and the thermally conductive material are formed on the second side of the semiconductor die in series;
    the lead finger includes a first portion in contact with the solder ball and a second portion extending beyond the encapsulant.

3. The microelectronic package of claim 1 wherein:
    the thermally conductive material is recessed in the openings at the second surface of the encapsulant.

4. The microelectronic package of claim 1 wherein:
    the microelectronic package further includes a solder paste in the openings, the solder paste being in contact with the thermally conductive material.

5. A microelectronic package, comprising:
    a semiconductor die'having a first side and a second side opposite the first side, the semiconductor die further including a thermally conductive material formed on the second side of the semiconductor die in series;
    a lead frame proximate the semiconductor die, the lead frame having a lead finger electrically coupled to the first side of the semiconductor die;
    an encapsulant at least partially encapsulating the semiconductor die and the lead frame, the encapsulant having a first surface opposite a second surface, and the encapsulant also including a plurality of openings extending toward the semiconductor die from the second surface; and wherein the plurality of openings individually expose a portion of the thermally conductive material and the thermally conductive material is generally solderable.

6. The microelectronic package of claim 5 wherein:

the thermally conductive material includes a titanium/nickel/silver (Ti/Ni/Ag) tri-metal alloy formed on the second side of the semiconductor die;

the openings individually expose a portion of the titanium/nickel/silver (Ti/Ni/Ag) tri-metal alloy at the second side of the semiconductor die.

7. The microelectronic package of claim 5 wherein:

the thermally conductive material includes a titanium/nickel/silver (Ti/Ni/Ag) tri-metal alloy formed on the second side of the semiconductor die;

the openings individually expose a portion of the titanium/nickel/silver (Ti/Ni/Ag) tri-metal alloy at the second side of the semiconductor die; and the microelectronic package further includes a solder paste in the plurality of openings, the solder paste being in contact with the titanium/nickel/silver (Ti/Ni/Ag) tri-metal alloy.

* * * * *